United States Patent [19]

Matsuura

[11] Patent Number: 6,013,395
[45] Date of Patent: Jan. 11, 2000

[54] PHOTOMASK FOR USE IN EXPOSURE AND METHOD FOR PRODUCING SAME

[75] Inventor: Seiji Matsuura, Tokyo, Japan

[73] Assignee: NEC Corporation, Tokyo, Japan

[21] Appl. No.: 09/026,962

[22] Filed: Feb. 20, 1998

[30] Foreign Application Priority Data

Feb. 20, 1997 [JP] Japan .................................. 9-036143

[51] Int. Cl.$^7$ .................................................... G03F 9/00
[52] U.S. Cl. ........................................................ 430/5
[58] Field of Search ............................ 430/5, 322, 323, 430/324

[56] References Cited

U.S. PATENT DOCUMENTS

| 5,389,474 | 2/1995 | Iguchi et al. | 430/5 |
| 5,547,788 | 8/1996 | Han et al. | 430/5 |
| 5,592,259 | 1/1997 | Anzai et al. | 430/5 |

FOREIGN PATENT DOCUMENTS 7-56318  3/1995  Japan .

Primary Examiner—S. Rosasco
Attorney, Agent, or Firm—Foley, Hoag & Eliot LLP

[57] ABSTRACT

An exposure photomask which transfers a desired pattern onto a semiconductor substrate S, which has a step, has a region formed by a light-blocking film and a region formed by a translucent film. The ideal optical path difference between exposure light that passes through the translucent film and exposure light that passes through a completely transparent part and the ideal mask pattern size are determined based on the step in the semiconductor substrate, and on the desired pattern size, the pattern being formed in accordance with the ideal optical path difference and ideal mask pattern size. The thickness of the translucent film is established so that the optical path difference between exposure light that passes through the translucent film and the exposure light that passes through a completely transparent part is approximately equal to the step in the semiconductor substrate.

19 Claims, 12 Drawing Sheets

| MASK PATTERN SIZE (μm) | | | | | | | |
|---|---|---|---|---|---|---|---|
| 0.27 | 0.7 | 0.65 | 0.6 | 0.55 | 0.45 | 0.25 | 0 |
| 0.26 | 0.7 | 0.65 | 0.6 | 0.55 | 0.45 | 0.3 | 0 |
| 0.25 | 0.7 | 0.65 | 0.65 | 0.6 | 0.5 | 0.3 | 0 |
| 0.24 | 0.7 | 0.7 | 0.65 | 0.65 | 0.6 | 0.35 | 0 |
| 0.23 | 0.7 | 0.7 | 0.7 | 0.65 | 0.6 | 0.4 | 0 |
|  | 120 | 130 | 140 | 150 | 160 | 170 | 180 |

OPTICAL PATH DIFFERENCE (DEGREES)

(b)

| MASK PATTERN SIZE (μm) | | | | | | | |
|---|---|---|---|---|---|---|---|
| 0.27 | 0.381 | 0.364 | 0.346 | 0.329 | 0.312 | 0.299 | 0.294 |
| 0.26 | 0.369 | 0.35 | 0.331 | 0.312 | 0.294 | 0.282 | 0.273 |
| 0.25 | 0.355 | 0.335 | 0.316 | 0.296 | 0.275 | 0.258 | 0.25 |
| 0.24 | 0.339 | 0.319 | 0.298 | 0.276 | 0.25 | 0.231 | 0.22 |
| 0.23 | 0.323 | 0.302 | 0.28 | 0.254 | 0.228 | 0.2 | 0.184 |
|  | 120 | 130 | 140 | 150 | 160 | 170 | 180 |

OPTICAL PATH DIFFERENCE (DEGREES)

(a)

(b)

(a)

(b)

PHOTOMASK FOR USE IN EXPOSURE AND METHOD FOR PRODUCING SAME

BACKGROUND OF THE INVENTION

1. Field of the Invention

The present invention relates to a photomask for use in exposure in a projection type exposure system, and more specifically to a photomask for exposure that is suitable for exposing a material to be exposed, such as a semiconductor substrate, that has a step.2.

2. Description of Related Art

In recent years, an increase in the level of integration and a minimizing of the feature sizes in semiconductor devices as typified by DRAMs (dynamic random-access memories) has made the circuit pattern line width formed on a semiconductor substrate extremely small. Accompanying this, there is a need to transfer even smaller patterns using the lithography process that forms circuit patterns onto a semiconductor substrate.

In the currently used lithography process, a reducing projection-type exposure system (such as a stepper) is used to burn the circuit pattern of a photomask, using ultraviolet light into the photoresist that has been applied to the semiconductor substrate, so as to form the pattern.

To form the pattern, it is ideal to cause the surface of the substrate to coincide with the image-forming plane of the projection lens.

Because of the steps that occur to form elements and because the substrate itself is not flat, there occurs a shift between the two.

To form a pattern even if there is somewhat of a shift from the ideal image-forming plane, some depth of focus (range in the light axis direction over which the pattern can be formed) is necessary, and the achievement of this depth of focus is important, as is high resolution.

In general, the resolution R and depth of focus DOF in a lithography process that uses a reducing exposure method is given by the following equations, which are known as the Raleigh equations.

$$R = K1 \cdot \lambda 1 / NA \quad (1)$$

$$DOF = K2 \cdot \lambda 1 / (NA)^2 \quad (2)$$

In the above relationships, λ is the exposure wavelength in nm, NA is the numerical aperture of the lens, and K1 and K2 are process coefficients that depend on the resist process.

As can be seen from equation (1), the limiting resolution can be improved by making λ small and by making NA large. However, from equation (2), it can be seen that a short wavelength and a large NA result in a reduced depth of focus, DOF. At present, there is a sharp decrease in the depth of focus accompanying an improvement in resolution, thus making it difficult to achieve the required depth of focus.

As can be seen from equation (2), the reduction in the depth of focus is more gradual for a shortening of wavelength than it is for an increase in NA. For this reason, the wavelength has been made progressively smaller, there having been a shift from the g line (1=436 nm) to the i line (1=365 nm) of a mercury lamp, and further to the use of a KrF excimer laser (1=248 nm) as the light source for exposure.

Additionally, by making adjustments in the optics itself, it is possible to accommodate the above-described shrinking of features in the pattern, this overall approach being referred to as super-resolution technology.

Typical aspects of super-resolving technology can be classified into three types, according to where the adjustments are made, these being the approach of changing the light source shape in the projection optics (the deformed illumination method), the approach of changing the pupil plane of the projection lens (the pupil filter method), and the approach of changing the photomask used for exposure (phase shift method, halftone phase shift method, or the like).

The effect of these types of super-resolving technology depends upon the type of pattern on the exposure photomask.

In the halftone phase shift method (hereinafter referred to as the halftone method), instead of using a complete light-blocking film in the light-blocking section on the photomask, a translucent film which rotates the polarization of incident light by 180 degrees and partially passes the light is used, as disclosed in the Japanese Unexamined Patent Publication No. 8-31711, for example.

FIG. 12 shows the exposure photomask used in the past with the halftone method. As shown in FIG. 12(*a*) and (*b*), an exposure photomask of the past was a two-layer structure formed from a glass substrate 101 that serves as the mask substrate, and translucent film 102 which is attached to this glass substrate 101.

According to this halftone method, there is emphasis of high-order diffraction components in the mask, resulting in an improvement in the contrast of the light intensity on the wafer over a wide depth of focus.

The halftone method is particularly effective in improving the depth of focus for an isolated transmission pattern (a hole pattern for the case of a positive pattern). For example, in Y. Iwabuchi, et al, Jpn. J. Apply. Phys. 32 (1993) 5900, there is a description of the use of KrF excimer lithography to form an isolated 0.26 μm hole pattern. With NA=0.42 and s=0.5 (where s is the coherency factor), using a conventional mask, the depth of focus for a 0.26 μm hole pattern is 0.6 μm.

In contrast to this, by exposing using a halftone photomask having a transmissivity of 4%, the focal point is broadened to 1.2 μm.

Because the halftone method makes the fabrication of the mask relatively easy, it is currently being applied to mass production, chiefly using the iline lithography. Additionally, it has been reported that to maximize the effect of improving the focal point, it is desirable to make the phase shift be 180±5 degrees and to make the transmissivity be 5 to 10%.

However, in recent semiconductor devices, accompanying the increase in the level of integration, the cross-sectional structure has become extremely complex.

For this reason, the steps formed in the semiconductor substrate are of a size that cannot be compensated by using the above-described halftone method. Consider, for example, the case of applying the above-described exposure wavelength, optics conditions, and a halftone mask to form a 0.26 μm hole pattern in a substrate having a step of 0.6 μm. Because the focal point is 1.2 μm, a maximum up/down focusing margin of 0.6 μm is obtained. However, with exposure done with the focus position at the up/down center point position of the 0.6 μm step, the margin is 0.3 μm at the top part of the step and 0.3 μm at the bottom part of the step.

That is, considering the step the focal point is substantially limited to 0.6 μm.

As described above, the achievement of a substantially wide focal point with regard to a semiconductor substrate having a step as well represents a problem in terms of device fabrication.

In view of the above-described drawbacks in the prior art, an object of the present invention is to provide an exposure photomask capable of forming a desired pattern over the entire region of even a material to be exposed which has a step.

SUMMARY OF THE INVENTION

To achieve the above-noted object, a first aspect of the present invention is an exposure photomask for the transfer of a desired pattern onto a material to be exposed that has a step, this photomask having a region made of a light-blocking film and a region made of a translucent film, the ideal optical path difference between exposure light which passes through the above-noted translucent film and the exposure light which passes through a completely transparent part, and the ideal mask pattern size being determined based on the step in the material to be exposed and on the desired pattern size, the photomask being formed according to this ideal optical path difference and ideal mask pattern size.

And a second aspect of the present invention is an exposure photomask for transfer of a desired pattern onto a material to be exposed which has a step, the exposure photomask having a single body which being constructed so that a focal point of an exposure light which passes through a hole pattern provided in a first region of the exposure photomask and a focal point of an exposure light which passes through a hole pattern provided in a second region different from the first region thereof are different from each other.

While a third aspect of the present invention is a method for producing an exposure photomask for transfer of a desired pattern onto a material to be exposed having a step, the method comprising the steps of establishing a first region and a second region in a single transparent substrate corresponding to the step, setting a focal point of an exposure light passing through a hole pattern provided in one of the regions at a value different from that of an exposure light passing through a hole pattern provided in the rest of the regions and exposing an exposure light to a material to be exposed through a certain hole pattern so as to form desired hole patterns in each one of the regions, respectively.

In the present invention, the film thickness of the translucent film is established so that the optical path difference between the exposure light which passes through the above-noted translucent film and the exposure light which passes through the completely transparent part is equal to the focal point shift of the exposure light, which is approximately equal to the step in the material to be exposed.

Another aspect of an exposure photomask according to the present invention has a region is made of a translucent film and a two-layer region formed by that translucent region and a transparent film, the ideal optical path difference between exposure light which passes through a completely transparent part, that which passes through the region made of the translucent film and that which passes through the two-layer structure of the translucent film and the transparent film and the ideal mask pattern size being determined based on the step in the material to be exposed and on the desired pattern size, the photomask being formed according to this ideal optical path difference and ideal mask pattern size.

In the present invention as described above, the material to be exposed is, for example, a semiconductor substrate.

BRIEF DESCRIPTION OF THE DRAWINGS

FIG. 6(a, b) is a table which is used for a second embodiment of the present invention;

DETAILED DESCRIPTION OF THE PREFERRED EMBODIMENTS

Embodiments of present invention are described below, with reference being made to the relevant accompanying drawings.

While the descriptions to follow are based on the case in which the photomask of the present invention is for used in a 1:1 exposure system, with the exception of the mask pattern size, the present invention would be the same even if applied to a reducing-type exposure system.

Additionally, the descriptions that follow assume a positive type of photoresist.

Figure 1:
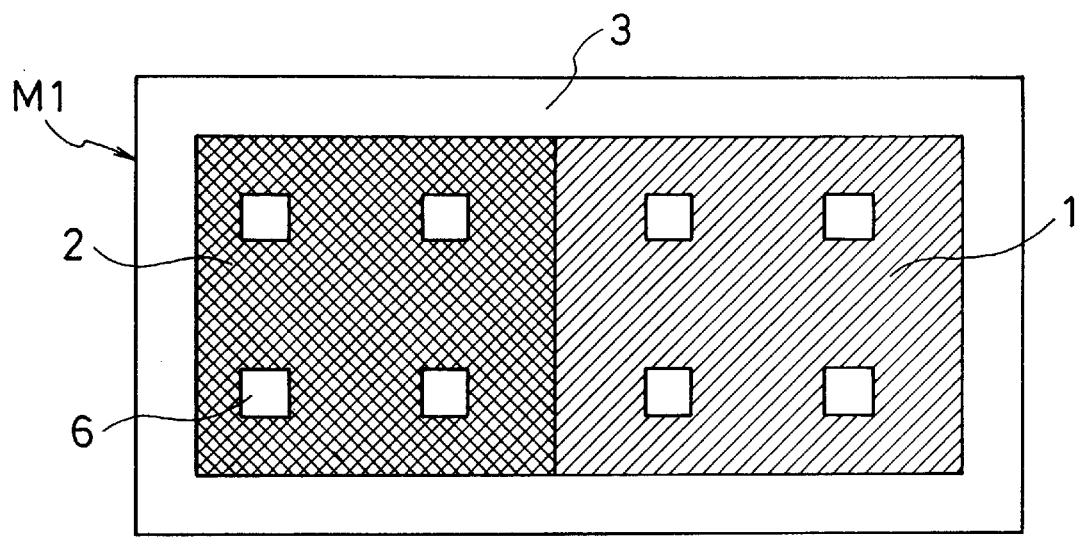
FIG. 1 shows an exposure photomask according to the first embodiment of the present invention, with FIG. 1(a) being a plan view thereof and FIG. 1(b) being a side cross-sectional view thereof.
Figure 1:
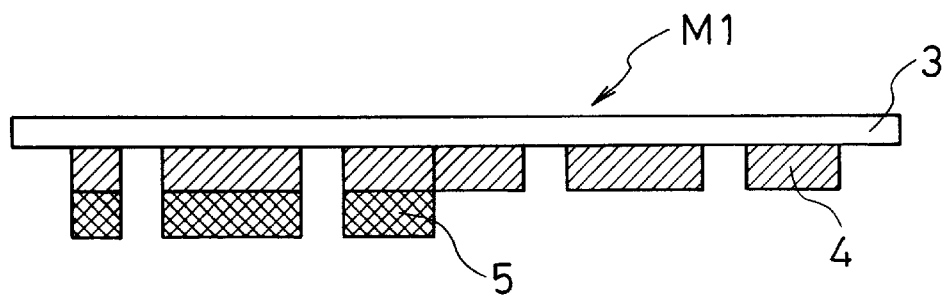

FIG. 1 shows an exposure photomask according to the first embodiment of the present invention, with (a) being a plan view thereof and (b) being a side cross-sectional view thereof. As shown in FIG. 1(a) and (b), the photomask M1 according to the present invention has a glass substrate 3 that serves as the mask substrate.

The first region 1 of the glass substrate 3 has a pattern formed by a single layer of a translucent film 4. The second region 2 of the glass substrate 3 has a pattern formed as a double-layer light-blocking film 5 formed by chrome which is applied over the translucent film 4. Both region 1 and region 2 have a pitch of approximately 1:3 (hole:space pitch), which forms a hole pattern 6.

Figure 2:
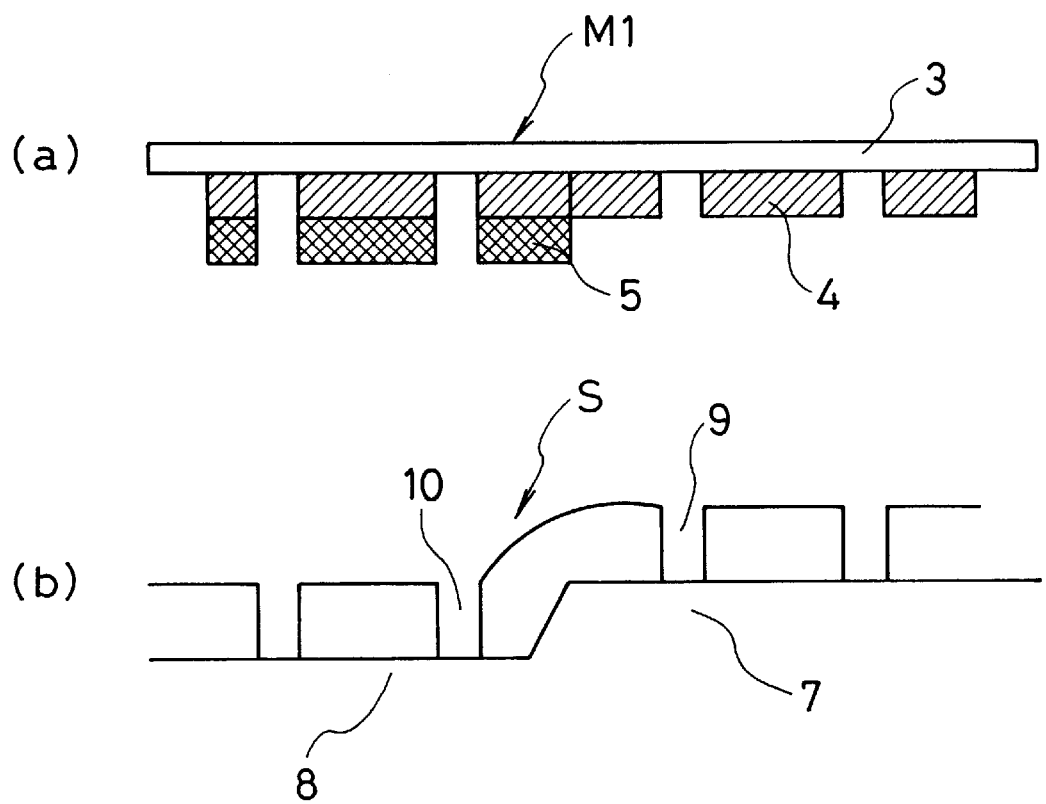
FIG. 2(a, b) is a side cross-sectional view which shows an exposure photomask according to the first embodiment of the present invention, and positional relationship thereof to a substrate that has a step.

FIG. 2 is a side cross-sectional view which shows the positional relationship between an exposure photomask according to the present invention and a semiconductor substrate which has a step.

In FIG. 2, the projection optics system has been omitted for the sake of simplicity, the position direction of focus being taken as the direction in of approach to the projection lens.

As shown in FIG. 2, the first mask region 1 corresponds to the top part 7 of the step in the semiconductor substrate S, and the second mask region corresponds to the bottom part 8 of the semiconductor substrate S.

It is also possible for the positional relationship between the exposure photomask M1 and the semiconductor substrate S to be the opposite of this.

The film thickness of the translucent film 4 is established so that the optical path difference between the light that passes therethrough and the light that passes through the completely transparent part is the focal point shift, which is equal to the step at the step top part 7 and the step bottom part 8 of the semiconductor substrate S.

The pattern size in the first mask region 1 and the second mask region 2 are designed so that the desired dimensions of pattern 9 and pattern 10 are obtained at the step top part 7 and the step bottom part 8 of the semiconductor substrate S.

If the pattern size in the second mask region 2 is made according to the design, there is a need to correct the pattern size in the first mask region 1.

Next, the method of determining the ideal optical path difference and mask pattern size in the first mask region 1 will be described.

For the purpose of this description, KrF excimer lithography is used, with the conditions NA=0.5 and σ=0.5, a 0.25 µm hole pattern with a pitch of 1:3 being formed at the step top part and step bottom part of the semiconductor substrate S. The transmissivity of the translucent film is 5%.

Figure 3:
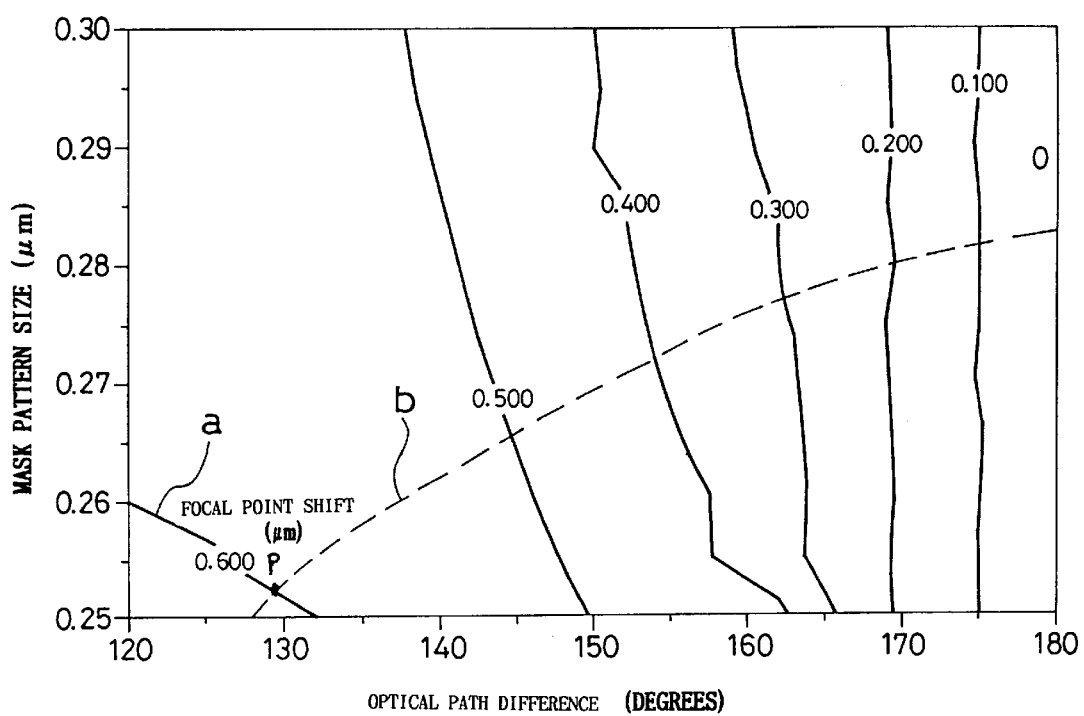
FIG. 3 is a graph which shows the relationship between the amount of focal point shift, the optical path difference, and the mask pattern size, as determined by a simulation.

FIG. 3 is a graph which shows the relationship between the focal point shift, the optical path difference, and the mask pattern size, this being determined by simulation.

In FIG. 3, the region of optical path difference from 120 to 180 degrees is shown, the focal position being defined as the point at which the pattern size is maximum on the semiconductor substrate.

When the optical path difference is 180 degrees, the amount of the length of the focal point shift is zero, this condition corresponding to the halftone method used in the past.

In the optical path difference range of 0 to 180 degrees, as the optical path difference moves away from either 0 degree or 180 degrees, the amount of length of focal point shift becomes larger in the positive direction (the direction moving closer to the projection lens).

In the optical path difference region of 180 to 360 degrees, as the optical path difference moves away from either 180 degrees or 360 degrees, the amount of length of focal point shift becomes larger in the negative direction (the direction moving away from the projection lens).

Figure 4:
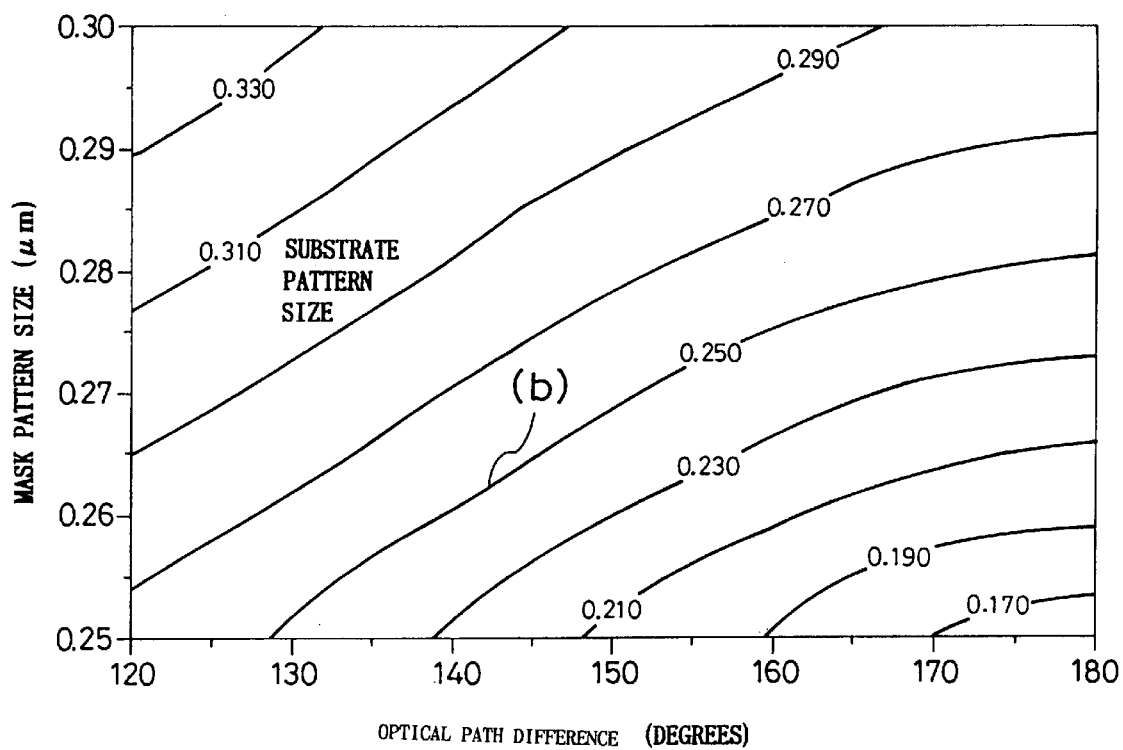
FIG. 4 is a graph which shows the relationship of the pattern size that is actually transferred onto a semiconductor substrate, the optical path difference, and the mask pattern size, as determined by a simulation.

FIG. 4 is a graph which shows the relationship between the pattern size actually transferred onto the semiconductor substrate S and the mask pattern size.

In FIG. 4 the optical path difference region from 120 degrees to 180 degrees is shown. As can be seen from FIG. 4, as the optical path difference approaches 180 degrees, for a given mask pattern size, the pattern size which is transferred onto the semiconductor substrate S becomes smaller.

From the graphs of FIG. 3 and FIG. 4, the ideal optical path difference and ideal mask pattern size can be determined.

For example, to obtain a 0.6 µm length of focal point shift and a 0.25 µm pattern size, it can be seen that it would be appropriate to use a mask pattern size of 0.253 µm or so, and a optical path difference of 128 degree.

Note that when the ideal optical path difference and the ideal mask pattern size should be determined in the present invention, they can be obtained as the following manner, for example.

As shown in FIG. 3, since a relationship between the mask pattern size and the optical path difference with utilizing a length of focal point shift as a parameter is shown and thus when a step formed in the surface of the material to be exposed has a height of 0.6 µm, the actual focal point shift can be determined as 0.6 µm.

Accordingly, a curve a can be selected from FIG. 3, first.

While, as shown in FIG. 4, since a relationship between the mask pattern size and the optical path difference with utilizing a desired mask pattern size to be formed on a predetermined substrate or a material to be exposed, as a parameter, is shown and thus when the ideal pattern size of the exposure photomask should have a size value of 0.25 µm, a curve b can be selected from FIG. 4.

Thereafter, both tables are overlapped to each other as shown in FIG. 3, and find a cross point P formed by both curves a and b.

Then the coordinate data of the cross point P shows the ideal data for the mask pattern size of the exposure photomask and the optical path difference formed in this mask.

As mentioned above, one aspect of the method for producing an exposure photomask in the present invention is a method for producing an exposure photomask wherein the method comprising the steps of;

a first step of preparing a first table representing a relationship between the mask pattern size and the optical path difference with utilizing a focal point shift as a parameter,;

a second step of preparing a second table representing a relationship between the mask pattern size and the optical path difference with utilizing a desired pattern size to be formed on a predetermined substrate or a material to be exposed, as a parameter,;

a third step of obtaining ideal optical path difference and ideal mask pattern size data by selecting a focal point shift information corresponding to the step and a desired pattern size to be formed on a desired substrate or material to be exposed, from the first and the second tables;

a fourth step of adjusting a thickness of at least one of the translucent film and the light-passing film provided in a predetermined region in the exposure photomask in response to the selected optical path difference information obtained in the third step; and a fifth step of forming hole patterns having a predetermined size in at least the translucent film provided on a transparent substrate in response to the mask pattern size selected in the third step.

Therefore, in the present invention, it would be very important to prepare the first table and the second table as mentioned above, previously and use both tables so as to obtain the ideal data for the mask pattern size of the exposure photomask and the optical path difference formed in this mask.

On the other hand, the exposure photomask of the present invention has basically a technical feature in that the exposure photomask for transfer of a desired pattern onto a material to be exposed which has a step, the exposure photomask having a single body which being constructed so that a focal point of an exposure light which passes through a hole pattern provided in a first region of the exposure photomask and a focal point of an exposure light which passes through a hole pattern provided in a second region different from the first region thereof is different from each other.

Further in the present invention, the difference in the focal point between the first and second regions corresponds to a step provided on a material to be exposed the exposure light.

In the present invention, the exposure photomask may comprise one of the regions comprising a transparent substrate and a translucent film having a predetermined hole pattern therein and laminated on the transparent substrate, and the rest of the regions may comprise a transparent substrate and a translucent film having a predetermined hole patterns therein and laminated on the transparent substrate and a light-blocking film having a predetermined hole patterns identical to those of the translucent film, therein and laminated on the translucent film.

In the present invention, the exposure photomask may separately comprise one of the regions comprising a transparent substrate and a translucent film having a predetermined hole patterns therein and laminated on the transparent substrate, and the rest of the regions comprising a transparent substrate and a translucent film having a predetermined hole patterns therein and laminated on the transparent substrate and a light-passing film having a predetermined hole patterns identical to those of the translucent film, therein and laminated on the translucent film.

Moreover, in the present invention, the focal point can be varied by adjusting a optical path difference between a phase of an exposure light passes through a hole pattern provided in one of the regions formed in the transparent substrate and a phase of an exposure light passes through the translucent film or the translucent film and the light-passing film except for the hole pattern, and provided in the same region formed in the transparent substrate.

Further, in the present invention, the phase of the exposure light can be adjusted by changing a thickness of the transparent substrate or a thickness of the light-blocking film, and more precisely, the focal point of the exposure light in the present invention can be varied by adjusting an optical path difference between a phase of the exposure light passes through the hole pattern provided in one of the regions and a phase of the exposure light passes through the translucent film and the light-passing film formed in the region and except for the hole pattern.

Note that, in the present invention, the optical path difference can be set at a value selected from 0 to 180 degree or at a value selected from 180 to 360 degree.

On the other hand, the size of the hole pattern provided in the exposure photomask, can be determined with respect to the step and a desired size of the predetermined pattern to be formed on the material to be exposed.

Figure 5:
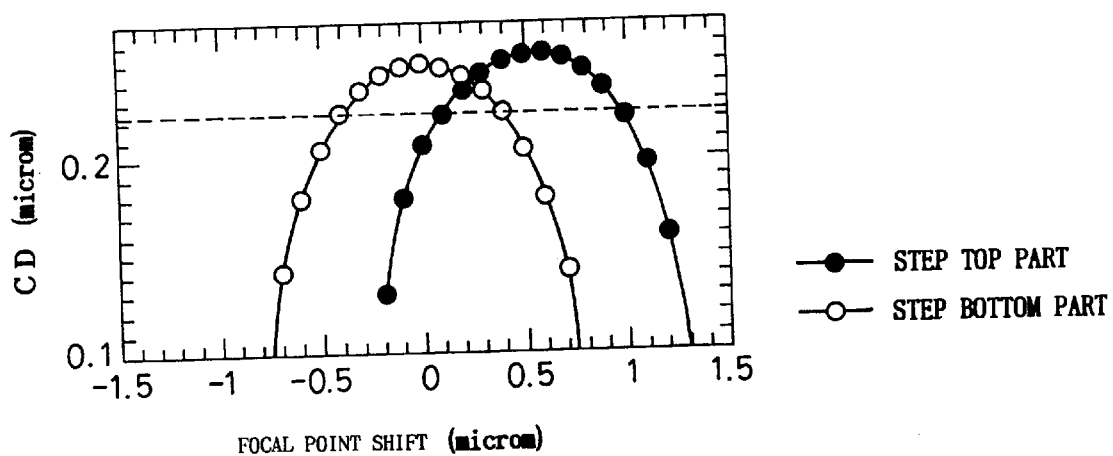
FIG. 5 is a graph which shows the CD vs focal point shift curves for the top and bottom of a step of a semiconductor substrate.

FIG. 5 shows the dimensional movement caused in the above case by focal point shifting.

The definition of the focal point is taken as the range over which the dimensional movement is within ±10%, the broken line of FIG. 5 indicating the value that is −10% with respect to the target dimension.

As can be seen from FIG. 5, it is expected that it is possible to obtain a focal point of approximately 0.8 $\mu$m at both the top part and the bottom part of the step of the semiconductor substrate S.

The second embodiment of the present invention will be explained with reference to FIGS. 6 to 9, hereunder.

FIG. 6(a) and FIG. 6(b) show simulation data obtained previously used for the second embodiment of the present invention and corresponding to the table 1 and table 2 as shown in FIG. 3 and FIG. 4, respectively.

FIG. 7(a) and FIG. 7(b) show a exposure photomask according to the second embodiment of the present invention, and FIG. 7(a) being a plan view thereof and FIG. 7(b) being a side cross-sectional view thereof.

As shown in FIGS. 7(a) and (b), this exposure photomask M2 has a glass substrate 13 that serves as the mask substrate. The first region 11 of the glass substrate 13 has a pattern formed by a single layer of a translucent film 14.

The region 12 of the glass substrate 13 has a pattern formed as a double-layer which is formed by the transparent film 15 which is applied over the translucent film 14.

The transparent film 15 serves the purpose of changing the phase without changing the transmissivity with respect to the first region 11 that is formed from only the translucent film 14.

FIGS. 8(a) is a side cross-sectional view which shows the positional relationship between a photomask and a semiconductor substrate which has a step.

In FIG. 8(a), the mask region 11 (as shown in FIG. 7(a)) corresponds to the step top part 17 of the semiconductor substrate S, and the second mask region 12 corresponds to the step bottom part 18 of the semiconductor substrate S. It is also possible for the positional relationship between the exposure photomask M2 and the semiconductor substrate S to be the opposite of this.

The film thickness of the translucent film 14 is established so that the optical path difference between the light that passes through the completely transparent part 15 is equal to the focal point shift, which is equal to the step at the step top part 17 and the step bottom part 18 of the semiconductor substrate S.

The film thickness of the transparent film 15 is established so that the optical path difference between light that passes through the translucent film 14 and transparent film 15 of the second mask region 12 and the light that passes through the completely transparent part is 180 degrees.

The pattern size of the first mask region 11 and the second mask region 12 are established so that the desired dimension of pattern 19 and pattern 20 are obtained at the step top part 17 and step bottom part 18.

If the pattern size in the second mask region 12 is made according to the design, there is a need to correct the pattern size in the first mask region 11.

In this embodiment, because the conventional halftone method is applied to the second mask region 12, it is possible to achieve a focal point that is wider than in the first embodiment, with regard to the step bottom part 18 of the semiconductor substrate S.

The method of determining the ideal optical path difference and the ideal mask pattern size for the first mask region 11 is the same as described for the first embodiment.

For the case in which the exposure light wavelength, the optics conditions, and the translucent film transmissivity are the same as noted for the first embodiment, assume that a 0.25 μm hole pattern with a 1:3 pitch is to be formed at the step top and bottom parts of the semiconductor substrate S.

In this case, the judgment is made by simulation that a optical path difference of approximately 160 degrees and a mask pattern size of approximately 0.24 μm are appropriate.

Figure 9:
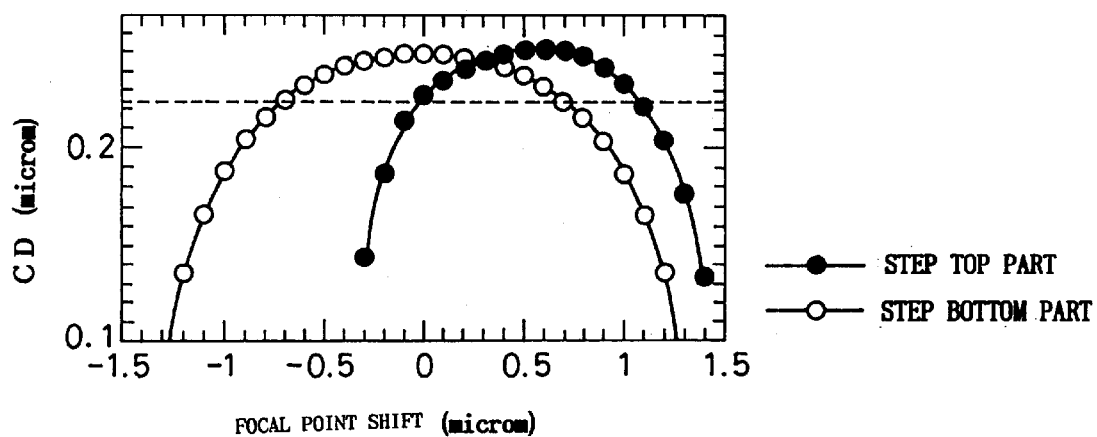
FIG. 9 is a graph which shows the CD vs focal point shift curves for the top and bottom of a step of a semiconductor substrate for the case of an exposure photomask according to the second embodiment of the present invention.

FIG. 9 shows the dimensional movement caused by focal point shifting in the above-noted case.

As can be seen from FIG. 9, it is expected that it is possible to obtain a focal point of approximately 1.1 μm at the step top part of the semiconductor substrate S, and a focal point of approximately 1.4 μm at the step bottom part of the semiconductor substrate S, these being obtained simultaneously. That is, the focal point when the step is considered is substantially 1.1 μm.

In this embodiment, the surface of the material to be exposed consisting of the lower portion of the step thereof is taken as a reference surface and thus the region 12 of the exposure photomask 13 is a reference region.

In FIG. 9, a curve having white circles shows the critical dimension CD of a pattern which will be formed in a resist in the region 12, while a curve having black circles shows the critical dimension CD of a pattern which will be formed in a resist in the region 11.

The ideal optical path difference and the ideal mask pattern size for the first mask region 11 can be obtained with the similar manner as explained in the first embodiment of the present invention with fixing the ideal optical path difference and the ideal mask pattern size for the region 12 as a reference.

As it is apparent from these embodiment of the present invention, a method for producing an exposure photomask for transfer of a desired pattern onto a material to be exposed having a steps, of the present invention comprises the steps of, establishing a first region and a second region in a single transparent substrate corresponding to the step, the step of setting a focal point of an exposure light passing through a hole pattern provided in one of the regions at a value different from that of an exposure light passing through a hole pattern provided in the rest of the regions and exposing an exposure light to a material to be exposed through a certain hole pattern so as to form desired hole patterns in each one of the regions, respectively.

In this method, the first region is provided corresponding to a lower portion of the step while the second region is provided corresponding to an upper portion of the step, and further wherein a focal point of an exposure light passing through a hole pattern provided in the first region is set at a value different from that of an exposure light passing through a hole pattern provided in the second region.

Further in the present invention, the method for producing an exposure photomask of the present invention has such construction in that either one of a surface of the first and the second regions may be selected as a reference surface of the focal point and a focal point of an exposure light passing through a hole pattern provided in a region separated from the region the surface of which is selected as a reference surface, is determined at a value being deeper or shallower than the focal point of an exposure light passing through a hole pattern provided in the reference surface.

Therefore, one specific embodiment of the present invention, the reference surface of the focal point is established at an intermediate portion of the step and further wherein the focal point of an exposure light passing through a hole pattern provided in the first region being set at a certain focal point which is deeper or shallower than the reference surface and the focal point of an exposure light passing through a hole pattern provided in the second region being set at a certain focal point which is shallower or deeper than the reference surface.

Next, an exposure photomask according to the third embodiment of the present invention will be described.

In the third embodiment, the reference surface is set at a position intermediate portion of the step.

Figure 7:
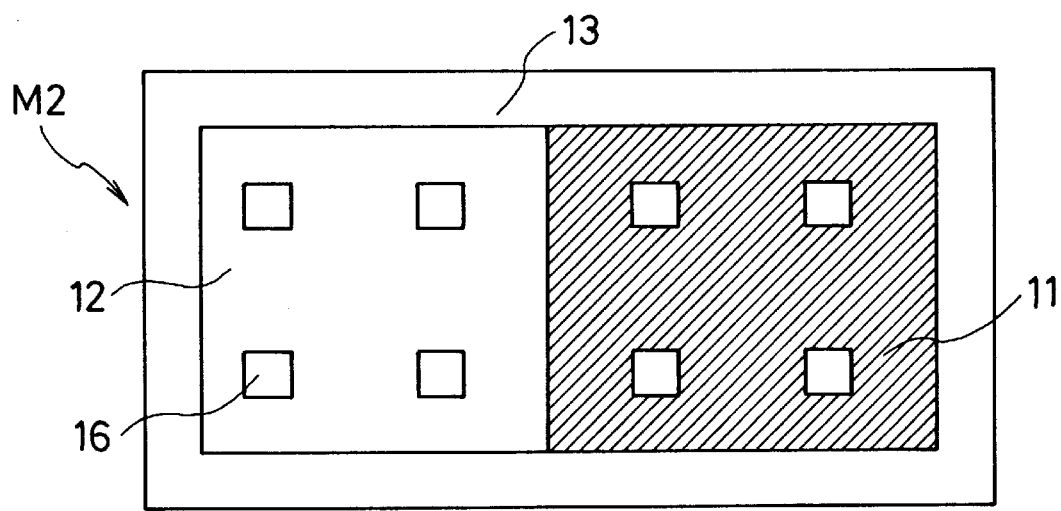
FIG. 7 shows an exposure photomask according to the second embodiment of the present invention, with FIG. 7(a) being a plan view thereof and FIG. 7(b) being a side cross-sectional view thereof.
Figure 7:
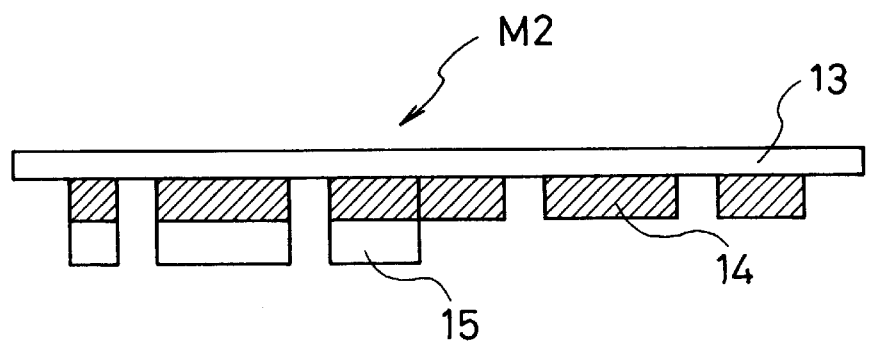
Figure 8:
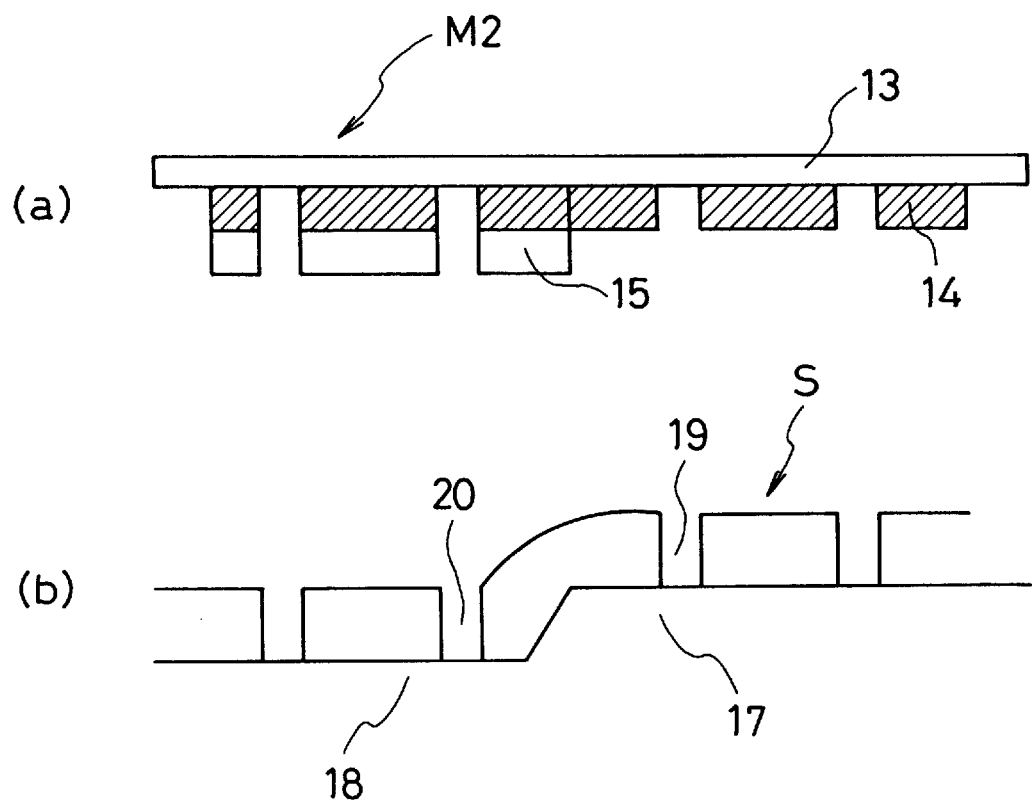
FIG. 8(a, b) is a side cross-sectional view which shows an exposure photomask according to the second embodiment of the present invention, and positional relationship thereof to a substrate that has a step.

The configuration of this exposure photomask and the positional relationship thereof to the substrate S are the same as the second embodiment which is shown in FIG. 7 and FIG. 8.

However, the optical path difference between light that passes through the translucent film 14 of the first mask region 11 and light which passes through the completely transparent part is shifted from 0 degree (or from 180 degrees) in the positive direction (the direction approaching the projection lens) and the optical path difference between light that pass through the translucent film 14 and the transparent film 15 of the second mask region 12 and the exposed light which passes through the completely transparent part is shifted from 0 degree (or from 180 degrees) in the negative direction (the direction moving away from the projection lens).

As described with regard to the first embodiment, with the optical path difference at around 0 or 180 degrees, the focal point shift direction is reversed top-to-bottom. Therefore, it is possible to obtain an even larger focal point than in the first and second embodiments.

The method of determining the ideal optical path difference and mask pattern size is the same as described for the first and second embodiments.

However, if the optical path difference occurring at the first mask region 11 is equal to the optical path difference occurring at the second mask region 12, the pattern size on the semiconductor substrate S is the same at the top and the bottom of the step, so that it is only necessary to consider the optical path difference.

For the case in which the exposure light wavelength, the optics conditions, and the translucent film transmissivity are the same as noted for the first and second embodiments, assume that a 0.25 μm hole pattern with a 1:3 pitch is to be formed at the step top and bottom parts of the semiconductor substrate S. In this case, the judgment is made by simulation that a optical path difference of approximately 130 degrees at the first mask region and a optical path difference of approximately −130(=230) degrees at the second mask region are appropriate.

Figure 10:
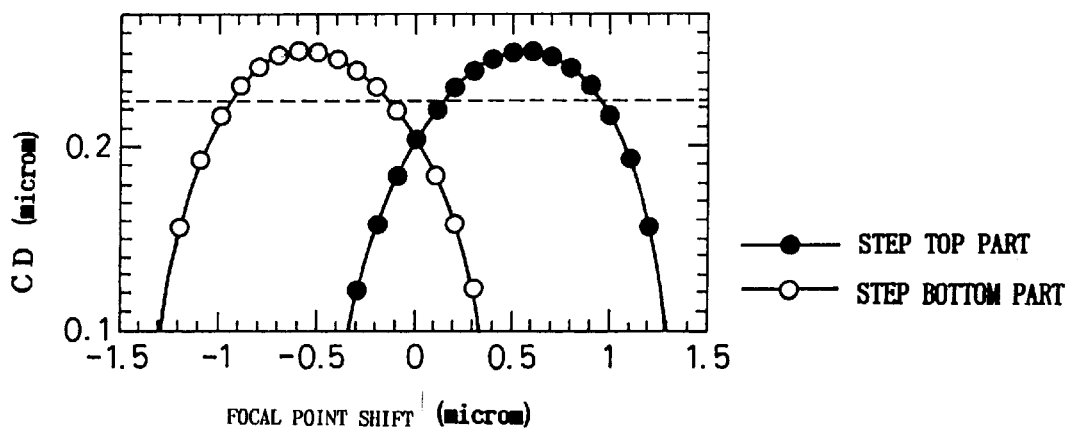
FIG. 10 is a graph which shows the CD vs focal point shift curves for the top and bottom of a step of a semiconductor substrate for the case of an exposure photomask according to the third embodiment of the present invention.

FIG. 10 shows the dimensional movement caused by focal point shifting in the above-noted case. As can be seen from FIG. 10, it is expected that it is possible to obtain a focal point of approximately 0.8 μm at both the step top part and the step bottom part of the semiconductor substrate S simultaneously. That is, the focal point when the step is considered is substantially 0.8 μm.

In the third embodiment of the present invention, as explained above, since the reference surface is positioned at a center portion of the height of the step and thus in the first region and the second region, exposure photomasks different from each other are prepared and used independently from each other.

Therefore, in the third embodiment, at least two sets of simulation data as shown in FIGS. 3 and 4 are required.

Figure 13:
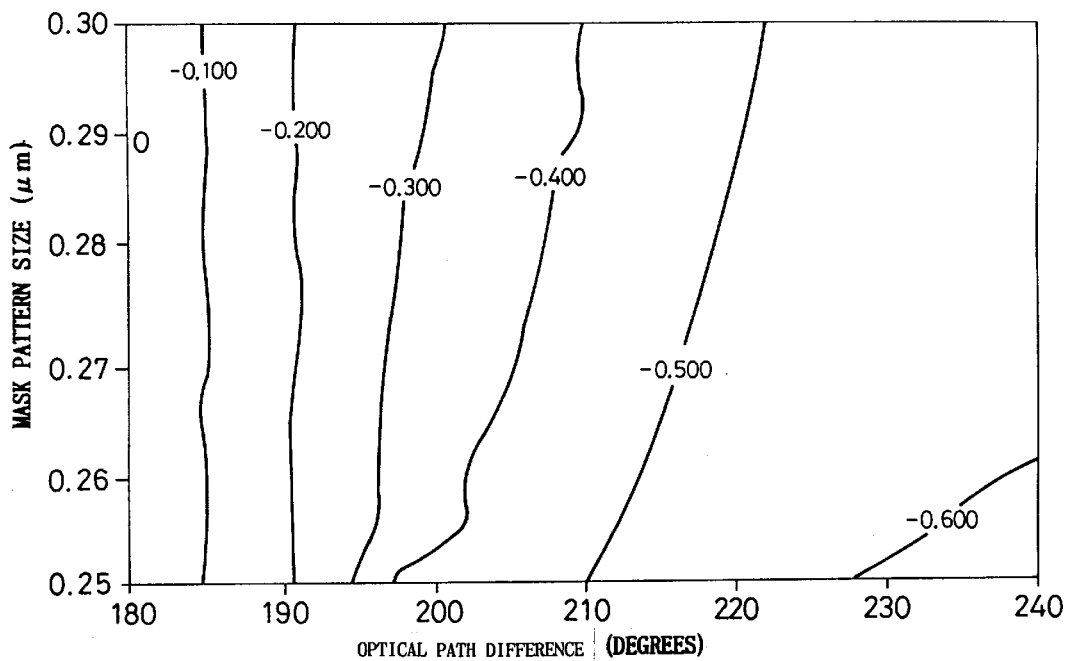
FIG. 13 shows a graph which shows the relationship between the amount of focal point shift, the optical path difference, and the mask pattern size, used for a third embodiment of the present invention.
Figure 14:
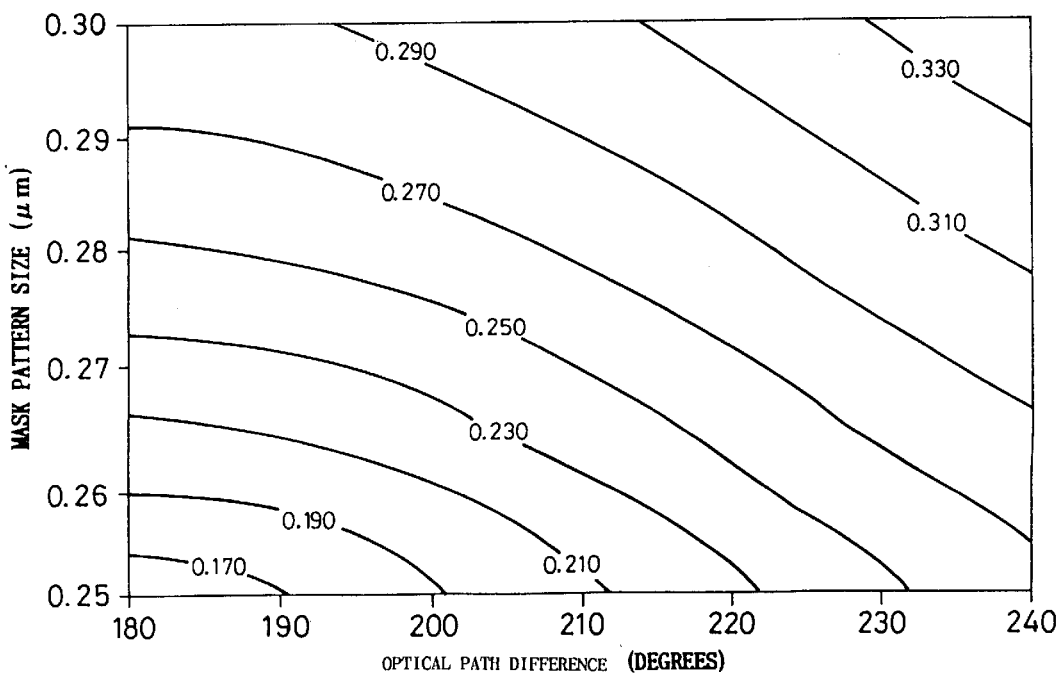
FIG. 14 is a graph which shows the relationship of the pattern size that is actually transferred onto a semiconductor substrate, the optical path difference, and the mask pattern size, as determined by a simulation and used for a third embodiment of the present invention.

In the third embodiment of the present invention, as one of the simulation data regarding the relationship between said mask pattern size and said optical path difference with utilizing a focal point shift as a parameter and the relationship between said mask pattern size and said optical path difference with utilizing a desired mask pattern size to be formed on a predetermined substrate or a material to be exposed, as a parameter, the simulation data as shown in FIGS. 3 and 4 can be used for the optical path difference between 0 to 180 degrees while as an opposite simulation data, used for the optical path difference between 180 to 360, the simulation data as shown in FIGS. 13 and 14 can be used.

Note that the simulation data as shown in FIGS. 13 and 14 have relatively mirror image of those as shown in FIGS. 3 and 4, respectively.

And thus, in the third embodiment of the present invention, the ideal optical path difference and the ideal mask pattern size for the first mask region 11 and the second mask region 12 can be obtained with the similar manner as explained in the first embodiment of the present invention.

Figure 11:
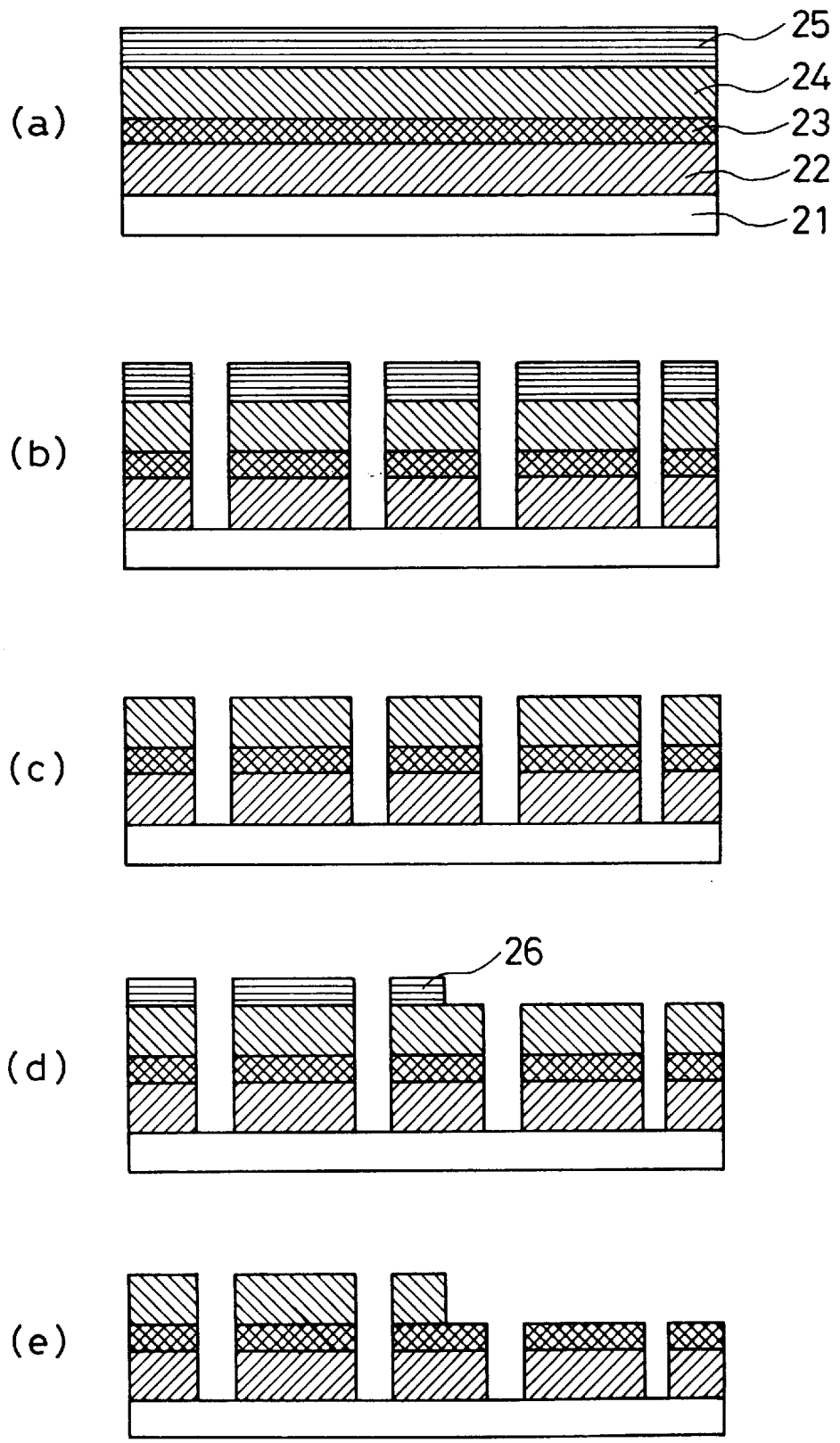
FIG. 11(a-e) is a drawing which illustrates the method of manufacturing the exposure photomask which is shown in FIG. 1.
Figure 12:
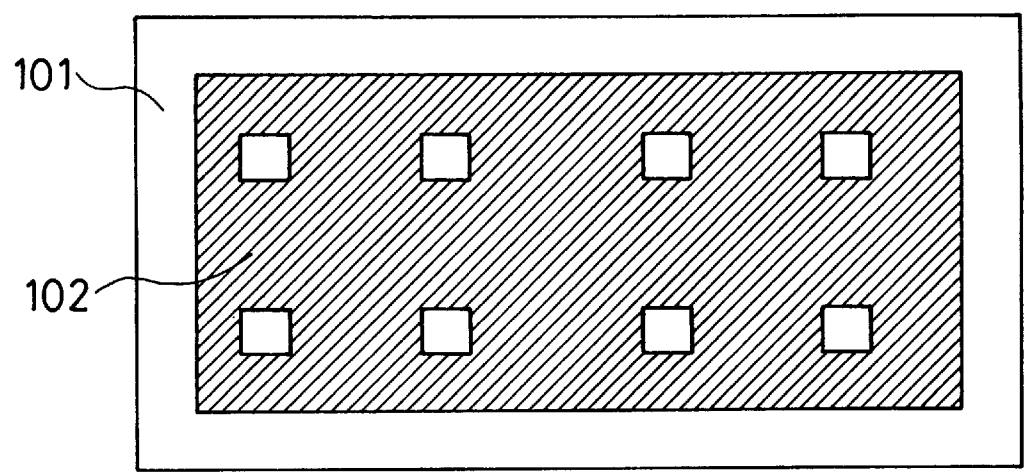
FIG. 12 shows an exposure photomask of the past which is used for the halftone method, with FIG. 12(a) being a plan view thereof and FIG. 12(b) being a side cross-sectional view thereof.
Figure 12:
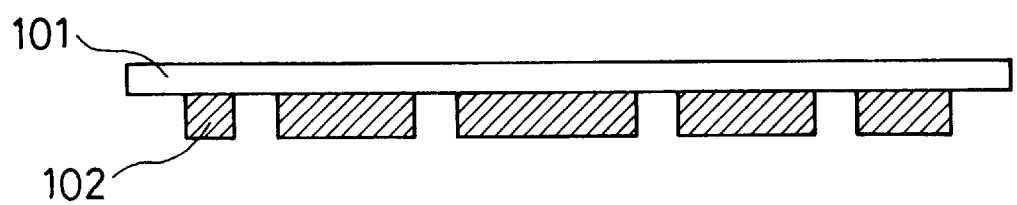

FIG. 11 is a drawing which illustrates a method of manufacturing the exposure photomask according to the present invention which is shown in FIG. 1. First, as shown in FIG. 11(a), onto a glass substrate 21, a MoSi based translucent film 22, a SiO3 film 23, a chrome film 24, and resist 25 are successively laminated as preparation.

The MoSi based translucent film 22 is adjusted so as to have a film thickness that provides an appropriate transmissivity. The chrome film 24 has a film thickness that completely blocks light. The SiO2 film 23 is transparent with respect to exposure light that is used with the mask.

Next, as shown in FIG. 11(b), a resist pattern is formed, this pattern is masked, and etching is done up to the MoSi based translucent film 22, after which the resist 25 is peeled off, to obtain the condition shown in FIG. 11(c).

Then, resist 26 is applied over the chrome film 24, and as shown in FIG. 11(d), a resist pattern is formed so that the resist 26 remains only on the first region. The resist is masked and the chrome film 24 only is etched, the results being as shown in FIG. 11(e), this being the finished exposure photomask according to the present invention. In this structure, the SiO2 film serves as an etching stopper.

Although in this manufacturing method the translucent film is formed by a MoSi based light-blocking film, there is no such limitation that is imposed, and a film having appropriate light-blocking characteristics and transmissivity can be used instead of chrome.

Because the optical path difference occurs because of the thickness of the translucent film, this can be obtained by adjusting the thickness and transmissivity of the MoSi based translucent film.

The present invention is not limited to the above-described embodiments, and a number of variations thereof are possible within the technical bounds recited in the claims.

For example, although as described above the embodiments of the present invention are applied to an exposure light wavelength of 248 µm, a 0.25 µm hole pattern, a pitch of 1:3, and a translucent film transmissivity of 5%, these are limitations which are imposed with regard to the exposure light wavelength, the pattern shape, the pattern dimensions, or the transmissivity, these parameters being changeable as is required.

Even if they are changed, it is possible using simulation or experimentation to optimize each of the parameters, to obtain the same kind of effect as obtained in the above-described embodiments of the present invention.

According to the present invention, an exposure photomask is provided which has a region made of a light-blocking film and a region made of a translucent film, the ideal optical path difference between exposure light that passes through the above-noted translucent film and the exposure light which passes through a completely transparent part, and the ideal mask pattern size being determined based on the step in the material to be exposed and on the desired pattern size, the result being that it is possible to move the focal position by a distance that is equal to the step at the stop top part and step bottom part of the semiconductor substrate S.

It is thus possible to form a desired pattern at the ideal focal position on both the step top part and step bottom part. It is also possible to improve the focal point which is substantially limited by the existence of the step.

What is claimed is:

1. An exposure photomask for transfer of a desired pattern onto a material to be exposed which has at least one step, said exposure photomask comprising:

a support member of substantially uniform thickness and having:

at least one first region of said exposure photomask with a translucent first film disposed on said support member, said first film including a first hole pattern extending therethrough; and at least one second region different from said first region and having a second film being at least one of: a light-blocking film and a light-passing film, the first film being interposed between the support member and the second film, the second region including a second hole pattern extending the first film and the second film, wherein a thickness of the first film provides a shift in a focal position of said pattern of said first region and said second region.

2. An exposure photomask according to claim 1, wherein said shift in said focal position between said first and second regions corresponds to the step provided on the material.

3. An exposure photomask according to claim 1, wherein said material to be exposed is a semiconductor substrate.

4. An exposure photomask according to claim 1, wherein said second film is a light-blocking film.

5. An exposure photomask according to claim 1, wherein said second film is a light-passing film.

6. An exposure photomask according to claim 5, wherein said shift in the focal position is varied by adjusting an optical path difference between a phase of an exposure lightahat passes through the second hole patterns and a phase of said exposure light that passes through said translucent film and said light-passing film formed in said region surrounding said hole pattern.

7. An exposure photomask according to claim 1, wherein said shift in the focal position is varied by adjusting an optical path difference between a phase of an exposure light that passes through the first hole pattern and a phase of the exposure light that passes through said translucent film surrounding said first hole pattern.

8. An exposure photomask according to claim 7, wherein said difference of the phase can be adjusted by changing a thickness of at least one of said translucent film and said light-passing film.

9. An exposure photomask according to claim 8, wherein said optical path difference can be set between a value greater than 0 and less than 180 degree or between a value greater than 180 and less than 360 degree.

10. An exposure photomask according to claim 1, wherein said first and second hole pattern provided in said exposure photomask has dimensions that are defined by said step and by dimensions of the transferred pattern to be formed on the material to be exposed.

11. An exposure photomask for transfer of a desired pattern onto a material to be exposed which has at least one step, said exposure photomask comprising:

a transparent support member having a uniform thickness and having:

a first region comprising a light-blocking film defining a first hole pattern extending therethrough, and a second region comprising a translucent film defining a second hole pattern, wherein a difference in an ideal optical path in the second region between an exposure light that passes through said translucent film and the exposure light that passes through said transparent support member and an ideal mask pattern size is determined based on said step of said material to be exposed and a dimension of a desired pattern to be exposed on said material, said desired pattern being formed in accordance with said ideal optical path difference and ideal mask pattern size.

12. An exposure photomask according to claim 11, wherein a thickness of said translucent film is established so that the optical path difference between the exposure light that passes through said translucent film and the exposure light that passes through said transparent support member is approximately equal to the step in said material to be exposed.

13. An exposure photomask for transfer of a desired pattern onto a material to be exposed which has at least one step, said exposure photomask comprising:

a transparent support member having a uniform thickness, a first region comprising a translucent film defining a first hole pattern extending therethrough, and a second region formed with a two-layer structure made from said translucent film and a light-passing film and defining a second hole pattern extending therethrough, wherein said exposure photomask is so formed utilizing an ideal optical path difference and an ideal mask pattern size, said ideal optical path difference and said ideal mask pattern size being determined by obtaining an ideal optical path difference between an exposure light that passes through the first region and between the exposure light that passes through the second region, based on said step of said material to be exposed and a dimension of said desired pattern to be exposed on said material.

14. An exposure photomask according to claim 13, wherein the thickness of said translucent film is established so that the optical path difference between the exposure light that passes through said translucent film and the exposure light that passes through the transparent material is approximately equal to the step in said material to be exposed, and wherein the thickness of said light-passing film is established so that the optical path difference between the exposure light that passes through said translucent film and said light-passing film and the exposure light that passes through the transparent material is set at around 180 degrees.

15. A method for producing an exposure photomask for transfer of a desired pattern onto a material to be exposed which has at least one step, said method comprising the steps of:

establishing on a transparent support member of uniform thickness a first region having a first hole pattern and a second region having a second hole pattern, said first and second regions corresponding to said step, adjusting a thickness of at least one of a translucent film and a light-passing film defining the first and second hole pattern for setting a focal point of an exposure light passing through one of said regions at a value different from that of the exposure light passing through the other of said regions, and exposing with the exposure light the material to be exposed through the first and second hole pattern so as to form the desired pattern on the material.

16. A method for producing an exposure photomask according to claim 15, wherein said first region is provided corresponding to a lower portion of said step while said second region is provided corresponding to an upper portion of said step, and further wherein the focal point of the exposure light passing through the hole pattern provided in said first region is set at a value different from that of the exposure light passing through the hole pattern provided in said second region.

17. A method for producing an exposure photomask according to claim 16, wherein a surface of one of said first and said second regions is selected as a reference surface of said focal point and another focal point of the other of said first and said second regions is determined at a value being deeper or shallower than said focal point of the region having said reference surface.

18. A method for producing an exposure photomask according to claim 16, wherein a surface of one of said first and said second regions is selected as a reference surface of said focal point at an intermediate portion of said step, so that the focal point of the exposure light passing through the hole pattern provided in said first region is deeper or shallower than said reference surface, and the focal point of the exposure light passing through the hole pattern provided in said second region is shallower or deeper than said reference surface.

19. A method-for producing an exposure photomask according to claim 15, wherein said method comprising the steps of:

a first step of preparing a first table representing a relationship between said mask pattern size and said optical path difference utilizing a length of the focal point shift as a parameter;

a second step of preparing a second table representing a relationship between said mask pattern size and said optical path difference utilizing a desired mask pattern size to be formed on the material to be exposed, as a parameter a third step of obtaining an ideal optical path difference and an ideal mask pattern size; data by selecting a length of focal point shift corresponding to said step and a desired mask pattern size to be formed on the material to be exposed, from said first and said second tables;

a fourth step of adjusting a thickness of at least one of said translucent film and said light-passing film provided in a predetermined region in said exposure photomask in response to said ideal optical path difference; and a fifth step of forming hole patterns having a predetermined size in at least said translucent film provided on the transparent support member in response to said ideal mask pattern size.

* * * * *